United States Patent
Sato

(10) Patent No.: US 9,501,967 B2
(45) Date of Patent: Nov. 22, 2016

(54) DISPLAY DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 46 days.

(21) Appl. No.: 14/484,316

(22) Filed: Sep. 12, 2014

(65) Prior Publication Data

US 2015/0077316 A1 Mar. 19, 2015

(30) Foreign Application Priority Data

Sep. 13, 2013 (JP) ................................. 2013-190933

(51) Int. Cl.
| | |
|---|---|
| *G09G 3/3208* | (2016.01) |
| *G09G 3/32* | (2016.01) |
| *G09G 3/38* | (2006.01) |
| *H01L 27/32* | (2006.01) |
| *G02F 1/1362* | (2006.01) |

(52) U.S. Cl.
CPC ........... *G09G 3/3208* (2013.01); *G02F 1/1362* (2013.01); *G09G 3/3233* (2013.01); *G09G 3/38* (2013.01); *H01L 27/3232* (2013.01); *G09G 2300/046* (2013.01); *G09G 2300/0426* (2013.01); *G09G 2300/0439* (2013.01); *G09G 2300/0842* (2013.01); *G09G 2320/0626* (2013.01); *G09G 2320/0666* (2013.01)

(58) Field of Classification Search
CPC .... G09G 3/3208; G09G 3/3233; G09G 3/38; G09G 2300/0842; G09G 2300/046; G09G 2300/0439; G09G 2300/0426; G09G 2320/0626; G09G 2320/0666; H01L 27/3232; G02F 1/13
See application file for complete search history.

(56) References Cited

U.S. PATENT DOCUMENTS

| | | | | |
|---|---|---|---|---|
| 2005/0259423 | A1* | 11/2005 | Heuser ................... | H01L 33/44 362/293 |
| 2006/0284633 | A1* | 12/2006 | Park ....................... | G09G 3/006 324/760.02 |
| 2007/0131949 | A1* | 6/2007 | Liu ...................... | H01L 27/3232 257/89 |
| 2009/0059110 | A1* | 3/2009 | Sasaki ............... | G02F 1/134363 349/39 |
| 2010/0277787 | A1* | 11/2010 | Fukuoka ................. | G09G 3/38 359/267 |

FOREIGN PATENT DOCUMENTS

| | | |
|---|---|---|
| JP | 2005-85683 A | 3/2005 |
| JP | 2009-186657 A | 8/2009 |
| JP | 2011-35087 A | 2/2011 |

* cited by examiner

*Primary Examiner* — Viet Pham
*Assistant Examiner* — Christopher Kohlman
(74) *Attorney, Agent, or Firm* — Typha IP LLC

(57) ABSTRACT

In a display device having a display area in which a plurality of pixels are formed to display an image, each of the plurality of pixels includes a brightness control layer that controls brightness of the pixel by light emission, and a light emission color control layer that controls a light emission color in the pixel by controlling a transmission wavelength band of a light emitted from the brightness control layer to be transmitted, and a light emission color control signal for controlling the transmission wavelength band to control the light emission color in the pixel is input to the light emission color control layer in each pixel.

8 Claims, 10 Drawing Sheets

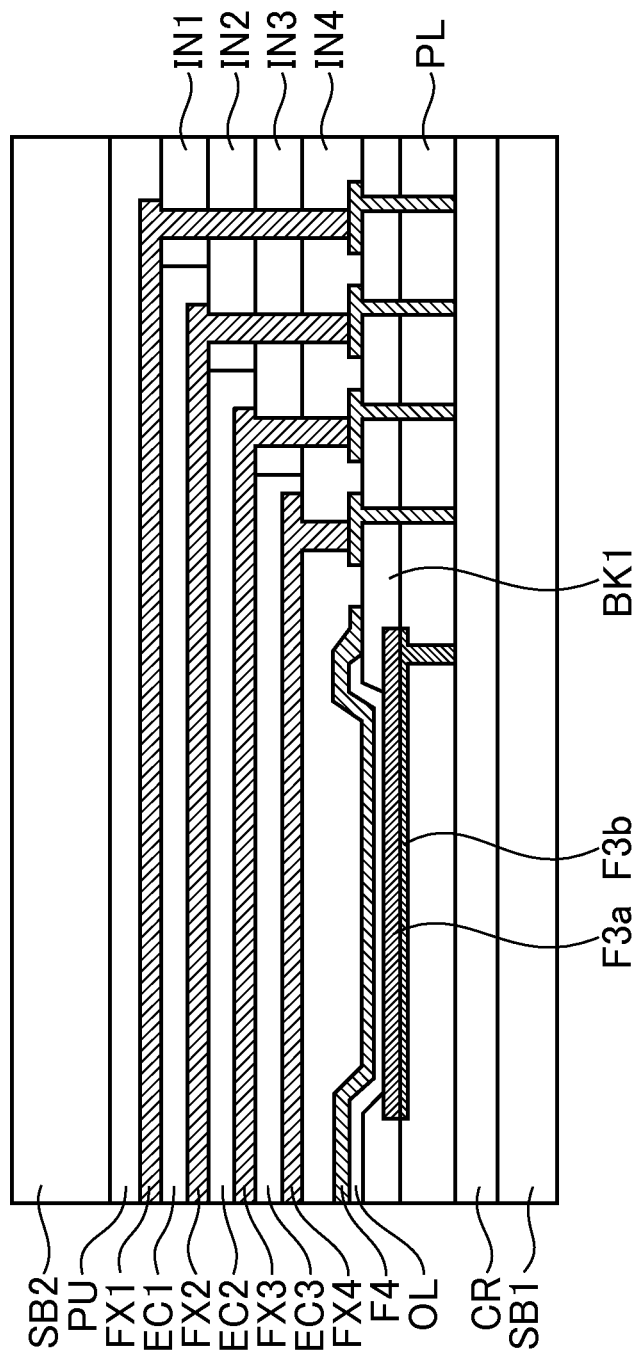

DISPLAY DEVICE

CROSS-REFERENCE TO RELATED APPLICATION

The present application claims priority from Japanese application JP2013-190933 filed on Sep. 13, 2013, the content of which is hereby incorporated by reference into this application.

BACKGROUND OF THE INVENTION

1. Field of the Invention

The present invention relates to a display device.

2. Description of the Related Art

In a display device having a color filter structure, one pixel is configured by three sub-pixels corresponding to color filter layers of, for example, red (R), green (G), and blue (B) to output a color image.

Also, in some of organic electroluminescence (EL) display devices, organic EL layers of plural colors such as RGB are arranged in the respective sub-pixels, individually, to output the color image.

SUMMARY OF THE INVENTION

In the display device that colors an emitted light with the above-mentioned color filter structure, or in the organic EL display device in which the organic EL layers of RGB are arranged in the sub-pixels, individually, at least three sub-pixels are necessary in one pixel, to thereby put a restriction on the higher definition. Also, the latter organic EL display device suffers from such a problem that a process margin becomes severe as the higher definition is advanced.

The present invention has been made in view of the above problem, and therefore an object of the present invention is to provide a display device suitable for higher definition. The above and other objects and novel features of the present invention will become apparent from the description of the present specification and the attached drawings.

In view of the above problem, according to the present invention, there is provided a display device having a display area in which a plurality of pixels are formed to display an image, each of the plurality of pixels including: a brightness control unit that controls brightness of the pixel by light emission; and a light emission color control unit that controls a light emission color in the pixel by controlling a transmission wavelength band of a light emitted from the brightness control unit to be transmitted, in which a light emission color control signal for controlling the transmission wavelength band to control the light emission color in the pixel is input to the light emission color control unit in each pixel.

Also, in the display device according to one aspect of the present invention, a light emission color control signal output unit that outputs the light emission color control signal outputs the light emission color control signal input to the plural pixels within the display area, individually, or the light emission color control signal input in common to plural pixels within each of partitioned areas into which the display area is partitioned.

Also, in the display device according to another aspect of the present invention, the light emission color control unit includes an organic electrochromic layer.

Further, in the display device according to another aspect of the present invention, the organic electrochromic layer is held between a first electrode layer and a second electrode layer, and the transmission wavelength band is controlled according to a signal supplied between the first electrode layer and the second electrode layer, the second electrode layer is formed in common to the plurality of pixels within the display area, and the first electrode layer is formed in common for every one or more rows, or for every one or more columns in the display area.

Further, in the display device according to another aspect of the present invention, the first electrode layer is connected to a signal line which is formed to extend to an outside of the display area, and transmits the light emission color control signal, through a contact hole formed in the outside of the display area.

Further, in the display device according to another aspect of the present invention, the brightness control unit includes an organic EL layer that emits a light by organic electroluminescence, and the organic EL layer is held between a third electrode layer formed on a side of the second electrode layer opposite to a side where the first electrode layer is formed, and the second electrode layer, and a brightness in the pixel is controlled according to a signal supplied between the second electrode layer and the third electrode layer.

According to the present invention, the display device suitable for higher definition can be provided.

BRIEF DESCRIPTION OF THE DRAWINGS

FIG. 7 is a schematic view illustrating a cross-section of one pixel in a display device according to a fourth embodiment.

DETAILED DESCRIPTION OF THE INVENTION

First Embodiment

Hereinafter, a display device according to a first embodiment of the present invention will be described with reference to the accompanying drawings.

In the display device according to this embodiment, plural pixels are arranged within a display area in which an image is displayed, and each of the plural pixels includes a brightness control unit and a light emission color control unit. The brightness control unit provided in each of the pixels receives a brightness control signal for controlling (designating) the brightness of an image to be displayed in the display area, and emits a light with an intensity corresponding to the designated brightness under control. Also, the light emission color control unit receives a light emission color control signal for controlling (designating) the light emission color in the pixel having the light emission color control unit, and controls a transmission wavelength band of the light emitted from the brightness control unit to be transmitted.

Figure 1:
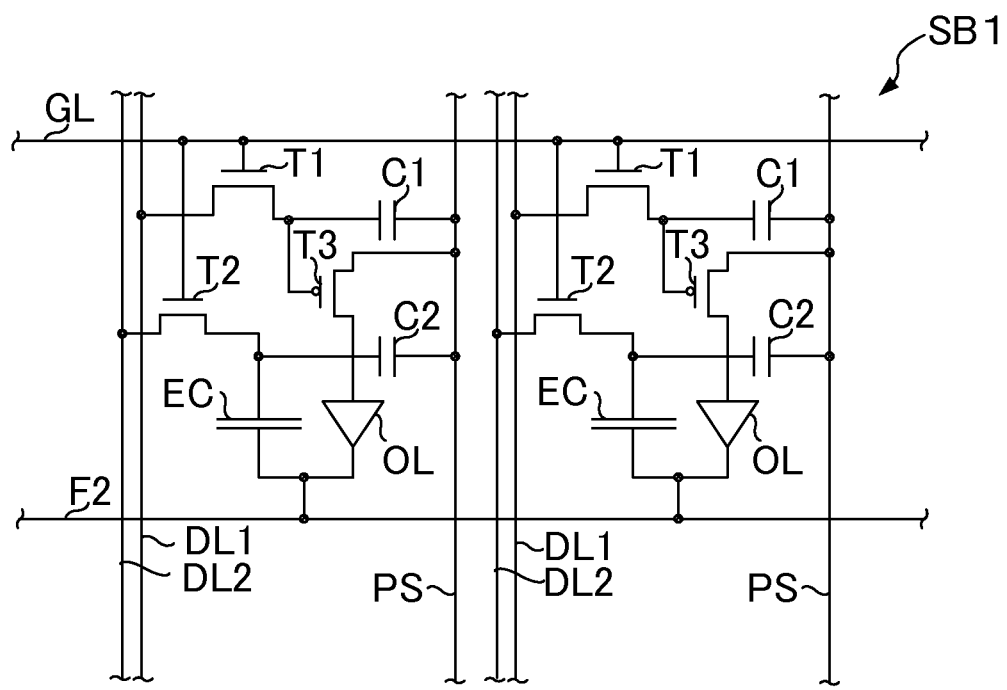
FIG. 1 is a circuit diagram illustrating a circuit disposed on a thin film transistor substrate in a display device according to a first embodiment.

FIG. 1 is a circuit diagram illustrating a circuit disposed on a thin film transistor substrate SB1 in the display device according to this embodiment. The display device according to this embodiment is formed of an organic EL display device in which the brightness control unit is configured by organic electroluminescent elements and the light emission color control unit is configured by organic electrochromic elements.

In the thin film transistor substrate SB1 of FIG. 1, a large number of scanning signal lines GL extend at regular intervals in a lateral direction of the figure, and a large number of first video signal lines DL1 for outputting the brightness control signal, and a large number of second video signal lines DL2 for outputting the light emission color control signal extend in a longitudinal direction of the figure. In the thin film transistor substrate SB1, the respective pixels arranged in a grid are partitioned by the scanning signal lines GL, and the first and second video signal lines DL1 and DL2. Further, thin film transistors T1, T2, T3 used for switching of an MIS (metal-insulator-semiconductor) structure, storage capacitors C1, C2, a brightness control layer OL formed of an organic electroluminescent layer, and a light emission color control layer EC formed of an organic electrochromic layer are formed on the thin film transistor substrate SB1. Also, power supply lines PS for applying a power supply to the brightness control layer OL extend in parallel to the first and second video signal lines DL1 and DL2 in the vertical direction of the figure.

In the circuit diagram of FIG. 1, any pixel row is selected by applying a gate voltage to the scanning signal lines GL to turn on the thin film transistors T1 and T2 simultaneously. When the brightness control signal and the light emission color control signal are supplied from the first video signal lines DL1 and the second video signal lines DL2, charges are accumulated in the storage capacitors C1 and C2. When the charges are accumulated in the storage capacitors C1 and C2, the thin film transistor T3 for driving which supplies a current to the brightness control layer OL turns on, and a current flows into the brightness control layer OL from the power supply lines PS to emit a light. The light emission color control layer EC transmits a light of a wavelength band corresponding to a potential difference generated between the light emission color control layer EC and a second electrode layer F2 which will be described later under the control.

The second video signal lines DL2 are connected to a video signal line drive circuit including a light emission color control signal output unit, and the light emission color control signal output unit outputs the light emission color control signal of three types corresponding to any peak wavelength of RGB to the light emission color control layer EC of the respective pixels.

Figure 2A:
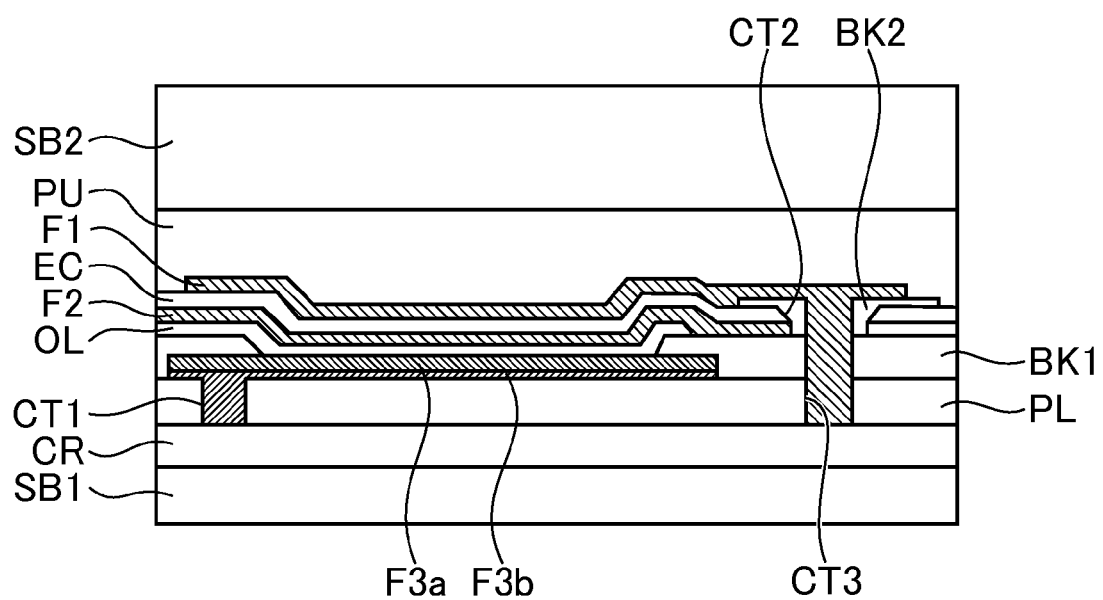
FIG. 2A is a schematic view illustrating a cross-section of one pixel in a display area of the display device according to the first embodiment.

FIG. 2A is a schematic view illustrating a cross-section of one pixel in the display area of the display device according to this embodiment. As illustrated in FIG. 2A, the display device according to this embodiment is configured so that the organic EL element and the organic electrochromic element are disposed on the thin film transistor substrate SB1, and those elements are covered with a sealing film PU and a counter substrate SB2.

First, the thin film transistor substrate SB1 and the counter substrate SB2 are each formed of a glass substrate (or a plastic substrate), and a circuit part CR and a planarizing layer PL as well as the organic EL element and the organic electrochromic element are laminated on a surface of the thin film transistor substrate SB1. Also, the sealing film PU is made of, for example, silicon nitride (SiN), and formed through a CVD.

The organic EL element is configured by holding the brightness control layer OL (brightness control unit) between the second electrode layer F2, and third electrode layers F3a, F3b. The brightness control layer OL is configured by an organic electroluminescent layer including a hole injection layer, a hole transport layer, a light emitting layer, an electron transport layer, and an electron injection layer. The brightness control layer OL according to this embodiment generates a white light. Specifically, the light emitting layer is configured by a laminated body of light emitting layers having the respective colors of RGB, and those emitted lights are mixed together to generate the white light.

The brightness control layer OL controls the light emission according to an electric signal supplied between the second electrode layer F2, and the third electrode layers F3a, F3b. The second electrode layer F2 is configured by thinning a transparent conductive film made of ITO (indium tin oxide), or an alloy film made of metal such as aluminum or silver to a light permeable degree to provide permeability and reflectivity. Also, the third electrode layer F3a is formed of a transparent conductive film made of ITO, and the third electrode layer F3b located on a lower side of the third electrode layer F3a is made of reflective metal such as aluminum. The second electrode layer F2 configures a cathode electrode (cathode) in the organic EL element, and the third electrode layers F3a and F3b configure an anode electrode (anode).

The second electrode layer F2 is configured by one layer common to the plural pixels arranged in a matrix in the display area, and receives a common voltage from a drive circuit outside of the display area. On the contrary, the third electrode layers F3a and F3b are isolated by a bank layer BK1 formed of an insulating layer for each of the pixels in the display area, and the brightness control signal from the first video signal lines DL1 is input to each of the pixels. The brightness control layer OL emits a light having an intensity corresponding to the brightness control signal, and inputs the emitted light directly to the second electrode layer F2, or inputs the emitted light to the second electrode layer F2 via the reflection of the third electrode layer F3b, to supply the emitted light to the light emission color control layer EC.

The organic electrochromic element is configured by holding the light emission color control layer EC (light emission color control unit) between a first electrode layer F1 and the second electrode layer F2, and positioned on an observer side of the organic EL element. The light emission color control layer EC configuring the organic electrochromic element is formed of a coloring layer made of an electrochromic material, and the second electrode layer F2 is common to the cathode electrode of the organic EL element. The first electrode layer F1 is an electrode formed of a transparent conductive film made of ITO, and formed for each of the pixels, individually. Therefore, in the display device according to this embodiment, the light emission color control signals are input to the light emission color control layers EC of the plural pixels within the display area, individually.

Specifically, the light emission color control layer EC according to this embodiment is made of an excellent electrochromic material that can display multiple colors which is produced by synthesizing polymers in which metal ions and organic molecules are bunched together with the use of an attraction (coordination bonds) exerted between the metal ions and the organic molecules. The light emission color control layer EC changes the transmission characteristic of the light by applying a voltage between the first electrode layer F1 and the second electrode layer F2. The light emission color control signal from the second video signal lines DL2 is input to the first electrode layer F1 to set the light emission color in the respective pixels, individually. Also, the light emission color control layer EC according to this embodiment transitions to a state in which a peak of a transmission spectrum is present in a wavelength band (equal to or higher than 350 nm, but lower than 450 nm) of red, a state in which the peak is present in a wavelength band (equal to or higher than 450 nm, but lower than 550 nm) of green, or a state in which the peak is present in a wavelength band (equal to or higher than 550 nm, but lower than 650 nm) of blue, according to a potential difference given by two electrodes.

The electrochromic material of the light emission color control layer EC is not particularly restricted if the material has a desired coloring characteristic. For example, in order to realize discoloration high in display quality, π-conjugated conductive polymer is preferable, and for example, a material containing conjugated polymers selected from a group consisting of polyparaphenylene, polythiophene, polyphenylene vinylene, polypyrrole, polyaniline, arylamine-substituted polyarylenevinylene, and polyfluorene polymer can be used.

Figure 2B:
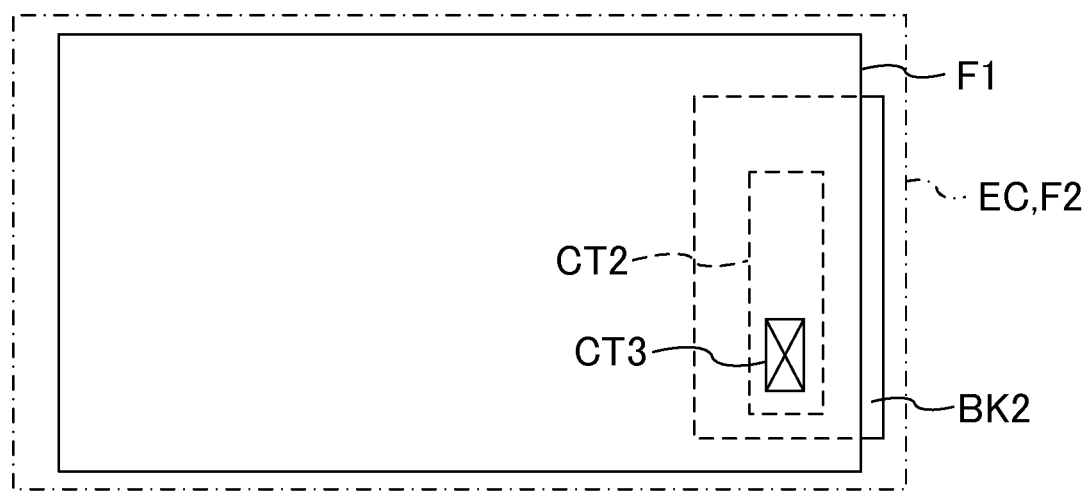
FIG. 2B is a diagram illustrating a planar configuration of a first electrode layer in one pixel of the display device according to the first embodiment.

Also, FIG. 2B is a diagram illustrating a planar configuration of the first electrode layer F1 in one pixel. In the organic EL display device according to this embodiment, the first electrode layer F1 is formed for each of the pixels within the display area one by one, and has a rectangular shape occupying a main portion within the area of one pixel. Also, the light emission color control layer EC and the second electrode layer F2 are formed over the overall surface of the display area in a planar shape with the substantially identical pattern shape. The light emission color control layer EC and the second electrode layer F2 are formed with a contact hole CT2 for the purpose of ensuring connection portions between the circuit parts CR of the thin film transistor substrate SB1, and the first electrode layers F1. A bank layer BK2 is formed in an area that covers the portion in which the contact hole CT2 is formed, and contact holes CT3 for connecting the first electrode layers F1 and the second video signal lines DL2 are further formed inside of the contact hole CT2.

The bank layer BK1 in this embodiment is formed in a square shape so as to surround an inside of the pixel area, and the bank layer BK2 is formed along one side of an outer periphery of the pixel area. The bank layer BK2 may be formed to surround the inside of the pixel area as with the bank layer BK1.

Figure 3:
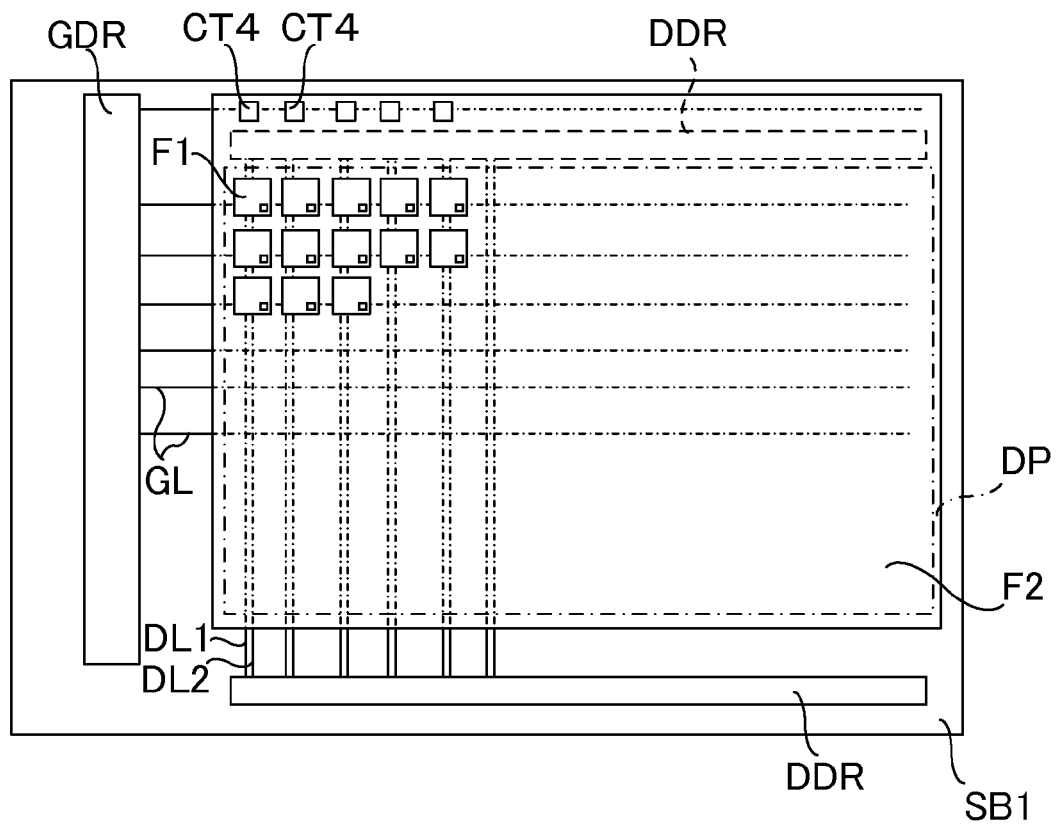
FIG. 3 is a diagram illustrating a state of electrode configurations and lines arranged on the thin film transistor substrate in the display device according to the first embodiment.

FIG. 3 is a diagram illustrating a state of electrode configurations and lines arranged on the thin film transistor substrate SB1 in the display device according to this embodiment. In FIG. 3, indication of the power supply lines PS is omitted, and a formation area of the second electrode layer F2 corresponds to a hatched area. A display area DP is set in an area inside of the second electrode layer F2, and the light emission color control layer EC not shown is formed in correspondence with the overall area of the display area DP.

As illustrated in FIG. 3, a scanning line drive circuit GDR that outputs a signal to the plural scanning signal lines GL, and video signal line drive circuits DDR that output signals to the first video signal lines DL1 and the second video signal lines DL2 are arranged in an area outside of the display area DP. Those signal lines are connected to the respective pixels within the display area DP. As illustrated in FIG. 3, the second electrode layer F2 is formed to cover the overall area of the display area DP, and one of the video signal line drive circuits DDR, and the first electrode layers F1 are arranged in the respective pixels one by one. The second electrode layer F2 applies a reference potential to the brightness control layer OL and the light emission color control layer EC through contacts CT4 arranged in plural portions further outside of the video signal line drive circuits DDR, and the first electrode layer F1 controls the transmission wavelength band in the light emission color control layer EC according to the light emission color control signal from the second video signal lines DL2.

In the display device according to the first embodiment, the respective pixels may be colored with plural colors in time sharing, and pixels adjacent in vertical and horizontal directions may emit lights with emission colors different from each other at given timing. Alternatively, for example, the pixels may emit light with common emission color for each row or column, and the emission colors may be different between the adjacent rows or columns under the control. Also, for example, if a rate of red in an image to be displayed is high, most of the pixels in the display area may be colored with red, or the emission colors may be determined for each of the pixels according to the image to be displayed.

Modification 1

Figure 4:
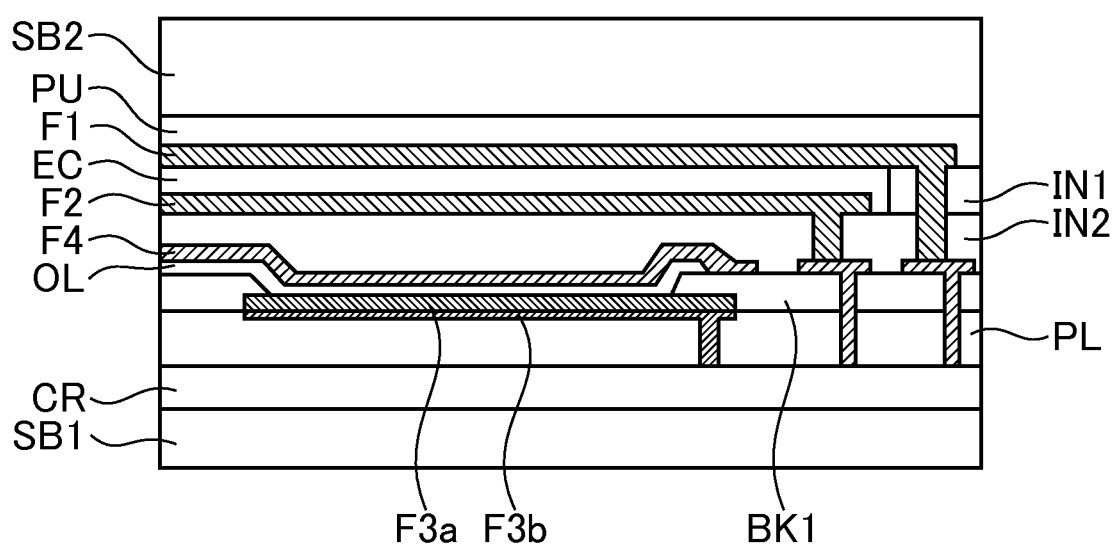
FIG. 4 is a schematic view illustrating a cross-section of one pixel in a display device according to a modification 1.

Subsequently, a modification 1 of the display device according to the first embodiment will be described. FIG. 4 is a schematic view illustrating a cross-section of one pixel in a display device according to this modification.

In the display device according to the first embodiment, the second electrode layer F2 in the respective pixels is shared by the organic electroluminescent elements and the organic electrochromic elements. Alternatively, in the display device according to the modification 1, a fourth electrode layer F4 and an insulating layer IN2 are further formed between the second electrode layer F2 and the brightness control layer OL, a signal is supplied to the light emission color control layer EC by the first electrode layer F1 and the second electrode layer F2, and a signal is supplied to the brightness control layer OL by a third electrode layer F3 and the fourth electrode layer F4.

Also, as illustrated in FIG. 4, the first electrode layer F1 is connected to the same metal layer as that of a cathode (fourth electrode layer F4) of the brightness control layer OL through a contact hole formed in insulating layers IN1 and IN2, and the second electrode layer F2 is connected to the same metal layer through a contact hole formed in the insulating layer IN2, whereby the first electrode layer F1 and the second electrode layer F2 are connected to the circuit part CR.

The display device according to the modification 1 is different in the above configuration from the display device according to the first embodiment, but the other configurations are substantially identical between the modification 1 and the first embodiment, and a description thereof will be omitted.

Second Embodiment

Subsequently, a display device according to a second embodiment will be described.

Figure 5A:
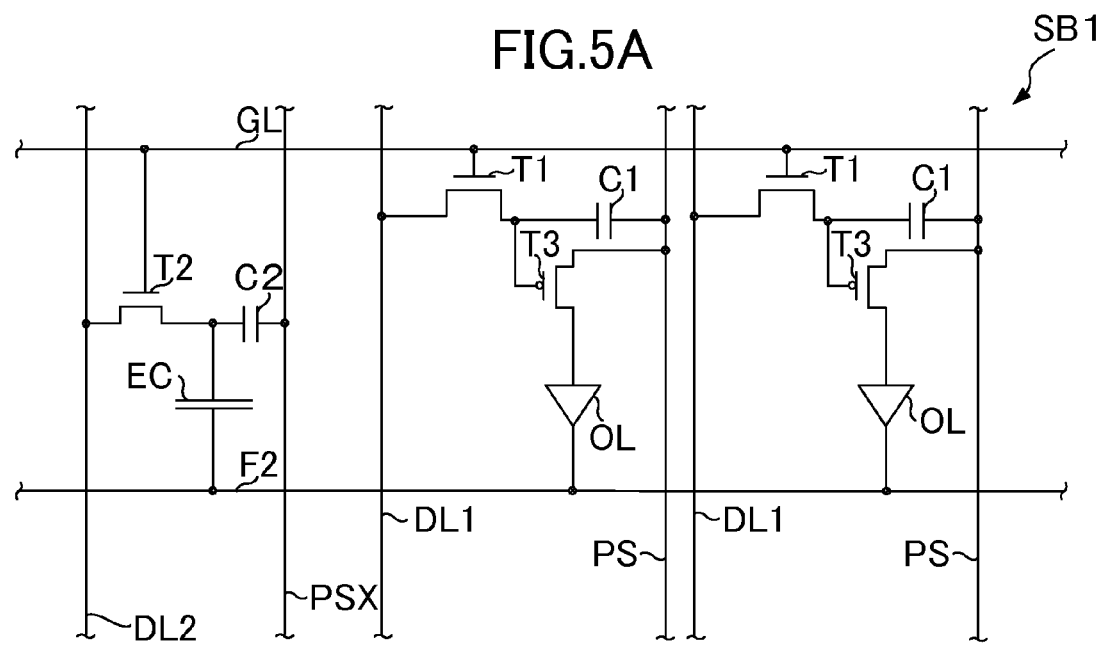
FIG. 5A is a circuit diagram illustrating a circuit disposed on a thin film transistor substrate in a display device according to a second embodiment.
Figure 5B:
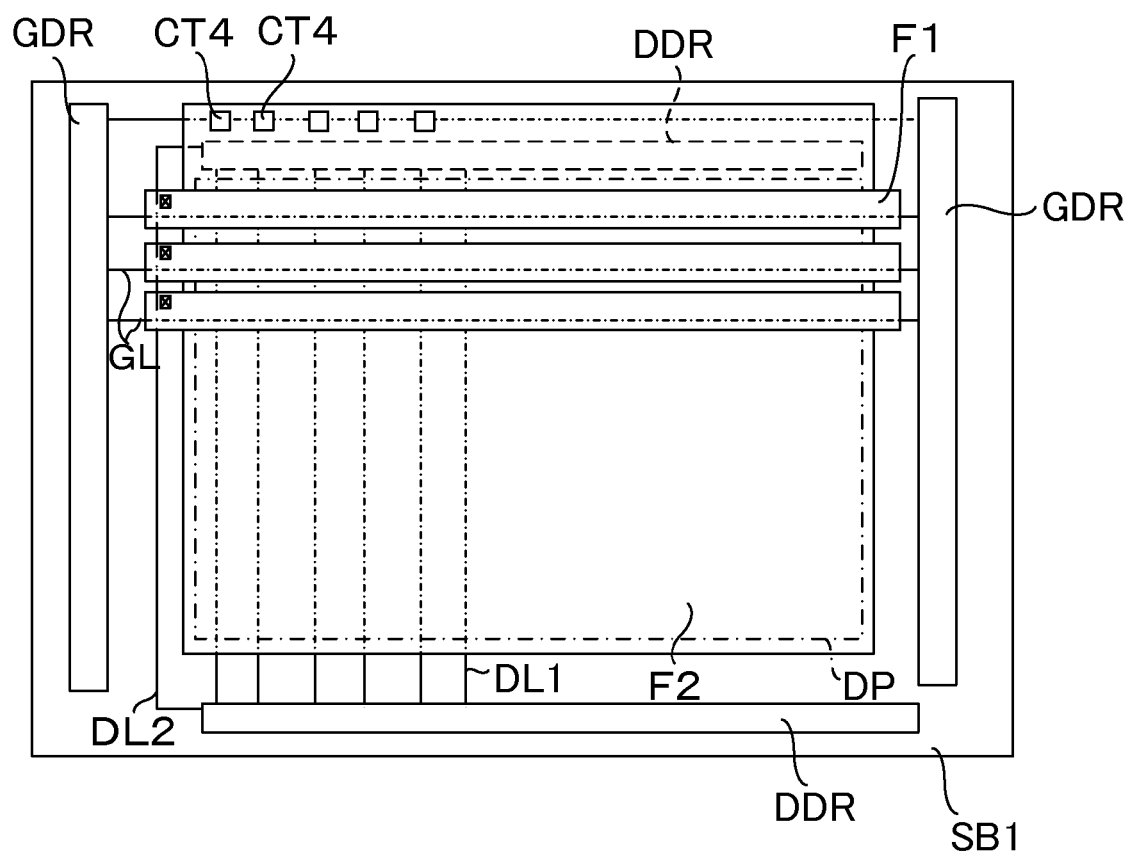
FIG. 5B is a diagram illustrating a state of electrode configurations and lines arranged on the thin film transistor substrate in the display device according to the second embodiment.

FIG. 5A is a circuit diagram illustrating a circuit disposed on a thin film transistor substrate SB1 in the display device according to the second embodiment, and FIG. 5B is a diagram illustrating a state of electrode configurations and lines arranged on the thin film transistor substrate SB1 in the display device according to the second embodiment.

As illustrated in FIGS. 5A and 5B, each of first electrode layers F1 in the display device according to the second embodiment are configured to be common to each row of plural pixels arrayed in a display area DP, and the respective first electrode layers F1 extend in a row direction, and arrive outside of the display area DP. Also, as in the first embodiment, an organic electrochromic layer configuring the light emission color control layer EC is arranged between the first electrode layer F1 and the second electrode layer F2, and a light emission color control signal is input to the organic electrochromic layer from second video signal lines DL2 at timing of the selection of any scanning signal line GL to control the emission color for each of the rows. A storage capacitor C2 is connected to a signal line PSX having the same potential as that of power supply lines PS to maintain a signal potential input from the second video signal line DL2 even after a thin film transistor T2 turns off.

Also, particularly, even in the second embodiment, the second video signal lines DL2 that supply the light emission color control signal to the light emission color control layer EC are laid outside of the display area DP, and contact holes for connecting the second video signal lines DL2 to the corresponding first electrode layers F1 are formed outside of the display area DP. Thus, the contact holes for connecting the first electrode layers F1 to the second video signal lines DL2 are formed outside of the display area DP, thereby being capable of extensively ensuring the light emission area in the respective pixels.

As illustrated in FIGS. 5A and 5B, the first electrode layer F1 according to the second embodiment includes a first end that extends from a first side (a left side in FIG. 5B) in the display area DP to the outside of the display area DP, and a second end that extends from a second side (a right side in FIG. 5B) to the outside of the display area DP. The contact holes are formed in only the first end, and connected to the second video signal lines DL2. However, the contact holes may be formed in both of the first end and the second end, and the light emission color control signal may be input from both ends of the first electrode layer F1 in synchronization. The light emission color control signal is input from the second video signal lines DL2 formed on both sides of the display area DP with the result that a response speed of the organic electrochromic layer to the light emission color control signal is preferably improved.

Except for the above configurations, the display device according to the second embodiment is substantially identical with the display device according to the first embodiment, and a description of the same configurations will be omitted.

Third Embodiment

Subsequently, a description will be given of a display device according to a third embodiment.

Figure 6A:
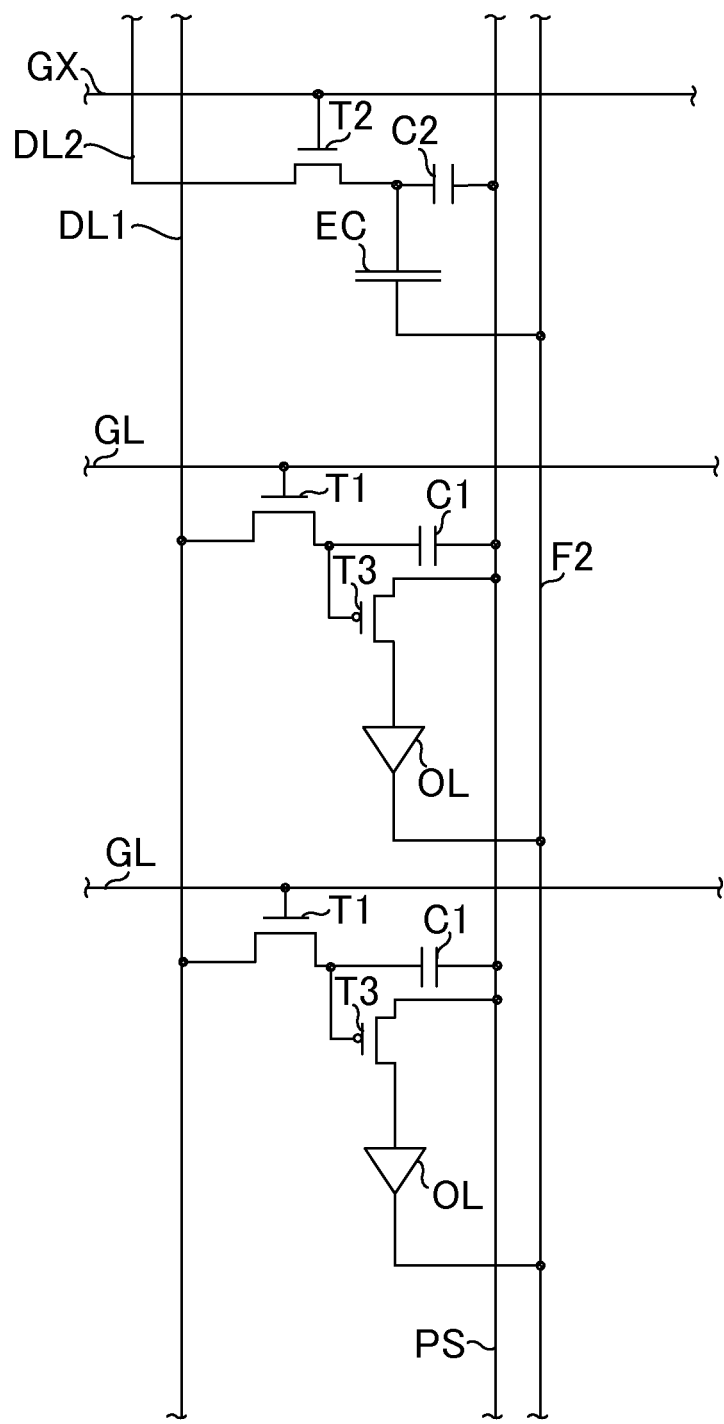
FIG. 6A is a circuit diagram illustrating a circuit disposed on a thin film transistor substrate in a display device according to a third embodiment.
Figure 6B:
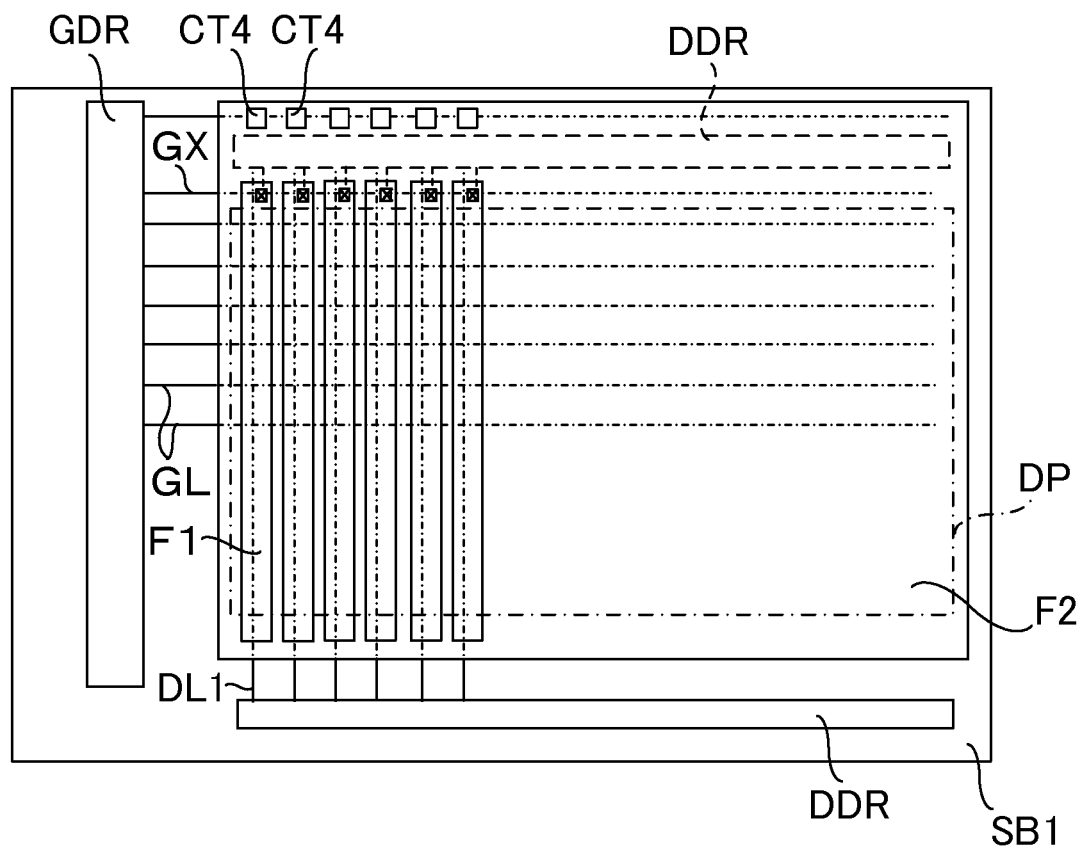
FIG. 6B is a diagram illustrating a state of electrode configurations and lines arranged on the thin film transistor substrate in the display device according to the third embodiment.

FIG. 6A is a circuit diagram illustrating a circuit disposed on a thin film transistor substrate SB1 in the display device according to the third embodiment, and FIG. 6B is a diagram illustrating a state of electrode configurations and lines arranged on the thin film transistor substrate SB1 in the display device according to the third embodiment.

As illustrated in FIGS. 6A and 6B, each of first electrode layers F1 in the display device according to the third embodiment are configured to be common to each column of plural pixels arrayed in a display area DP, and the respective first electrode layers F1 extend in a column direction, and arrive outside of the display area DP. Also, as in the first embodiment, an organic electrochromic layer configuring the light emission color control layer EC is arranged between the first electrode layer F1 and the second electrode layer F2, and a light emission color control signal is input to the organic electrochromic layer from the first video signal lines DL1 at timing of the selection of any scanning signal line GX to control the emission color for each of the rows. After inputting the light emission color control signal, the brightness control signal is output to the first video signal lines DL1 at timing of the selection of another scanning signal line GL.

Also, as in the second embodiment, in the third embodiment, the contact holes for connecting the first video signal lines DL1 to the first electrode layers F1 are formed outside of the display area DP. Thus, the contact holes for connecting the first electrode layers F1 to the first video signal lines DL1 are formed outside of the display area DP, thereby being capable of extensively ensuring the light emission area in the respective pixels.

As illustrated in FIGS. 6A and 6B, the first electrode layer F1 according to the third embodiment includes a first end that extends from a first side (an upper side in FIG. 6B) in the display area DP to the outside of the display area DP, and a second end that extends from a second side (a lower side in FIG. 6B) to the outside of the display area DP. The contact holes are formed in only the first end, and connected to the first video signal lines DL1. However, the contact holes may be formed in both of the first end and the second end, and the light emission color control signal may be input from both ends of the first electrode layer F1 in synchronization. The light emission color control signal is input from both of the ends through the first video signal lines DL1 with the result that a response speed of the organic electrochromic layer to the light emission color control signal is preferably improved.

Except for the above configurations, the display device according to the third embodiment is substantially identical with the display device according to the first embodiment, and a description of the same configurations will be omitted.

Fourth Embodiment

Subsequently, a description will be given of a fourth embodiment of the present invention. FIG. 7 is a schematic view illustrating a cross-section of one pixel in a display device according to the fourth embodiment.

In the display device according to the first embodiment, the light emission color control unit is configured by the multi-color electrochromic layer. However, in the display device according to the fourth embodiment, as illustrated in FIG. 7, the light emission color control unit includes an organic electrochromic layer EC1 that expresses a state in which a peak of a transmission spectrum is present in a wavelength band of red by application of a voltage, an organic electrochromic layer EC2 that expresses a state in which the peak is present in a wavelength band of green, and an organic electrochromic layer EC3 that expresses a state in which the peak is present in a wavelength band of blue. Further, four electrode layers FX1 to FX4 are formed to sandwich those organic electrochromic layers therebetween.

In the fourth embodiment, each of the organic electrochromic layers EC1 to EC3 is not supplied with a current in a state where a voltage is not applied to each organic electrochromic layer, and is basically transparent without being colored. In each of the pixels, the light emission color control signal from the light emission color control unit is output to the four electrode layers FX1 to FX4 through the contact holes formed in insulating layers IN1 to IN4. As a result, the voltage to be applied to the respective organic electrochromic layers EC1 to EC3 is controlled to change the transmission wavelength band of the light emitted from the brightness control layer OL to be transmitted.

In the display device according to the fourth embodiment, the four electrode layers FX1 to FX4 may be formed for each of the pixels, or may be formed for every one or more rows, or for every one or more columns. When the four electrode layers FX1 to FX4 are formed in common for each of the rows or the columns, it is preferable that the four electrode layers FX1 to FX4 are connected to the signal lines that input the light emission color control signals through the contact holes outside of the display area DP.

Except for the above configurations, the display device according to the fourth embodiment is substantially identical with the display device according to the first embodiment, and a description of the same configurations will be omitted.

In the above first embodiment, the light emission color control signal is input for each of the pixels. In the second or third embodiment, the light emission color control signal common to each row or column configured by the plural pixels is input. However, the first electrode layer F1 according to the present invention may be formed by one layer common to plural pixels within each of plural partitioned areas into which the display area DP is partitioned. The first electrode layer F1 may be formed by one layer common to plural rows or plural columns. For example, the display area DP is partitioned into areas of a 5×5 basis, and the first electrode layer F1 may be formed by one layer common to each partitioned area of 5×5. Also, the brightness control unit may be arranged on the thin film transistor substrate SB1 side, the light emission color control unit may be arranged on the counter substrate SB2 side, and the thin film transistor substrate SB1 and the counter substrate SB2 may be bonded through an adhesive layer. In this configuration, since the respective substrates can be fabricated, independently, there are advantages that the degree of freedom of the process increases, and a process yield is improved.

In the above respective embodiments, the light emission color control signals corresponding to the light emission colors of three types of RGB are input in time sharing. Alternatively, the transmission wavelength band of the light emission color control layer EC may be controlled to correspond to the emission colors of cyan, magenta, and yellow. Further, the transmission wavelength band of the light emission color control layer EC may be controlled to correspond to the emission colors including white (transparency). Also, the light emission color control layer EC is not controlled according to only the light emission color control signals corresponding to the emission colors of three types of RGB, but, for example, the degree of coloring of RGB may be controlled in plural stages. Alternatively, a light emission color control signal corresponding to a transmission wavelength distribution in which a transmission wavelength band of red and a transmission wavelength band of blue are mixed together may be used to control the light emission color control layer EC.

The above respective embodiments are applied to the organic EL display device of the top emission type, but the present invention is not limited to this configuration, and may be applied to an organic EL display device of a bottom emission type, or may be applied to other display devices.

In the display device according to the above first embodiment, the signal line for inputting the scanning signals is common to the gate electrodes of the thin film transistor T1 and the thin film transistor T2. However, the present invention is not limited to the above circuit configuration, but the scanning signal may be input to those transistors by signal lines different from each other. Also, in the display device according to the third embodiment, the brightness control signal and the light emission color control signal are output from the first video signal line DL1. However, the present invention is not limited to the circuit configurations described in the respective embodiments. Also, in the third embodiment, the second video signal lines DL2 may be laid aside from the first video signal lines DL1 whereby the light emission color control signal may be input to the light emission color control layer EC. Also, in the light emission color control unit, if there is a delay time since the light emission color control signal is supplied until the emission color changes, as how to synchronize the light emission color control unit with the brightness control unit, it is effective to use a system of controlling the brightness in conformity to the delay time and the amount of change from the viewpoint of high quality display. For example, a method can be applied in which the brightness is controlled in a pulsed light emission period having a desired width in a stable period where the emission color has been changed to a desired color.

In the above respective embodiments, all of the pixels within the display area DP have the brightness control layer OL and the light emission color control layer EC. Alternatively, for example, at least parts of the plural pixels may include the brightness control layer OL and the light emission color control layer EC. Therefore, for example, plural pixels having the light emission color control unit for coloring in modes of two types of red and green, and the brightness control unit, and plural pixels having no light emission color control unit, but having the brightness control unit that emits a light of blue may be mixed together in the display area DP. The pixels having the light emission color control unit may emit the light in at least two kinds of transmission wavelength distributions.

The present invention is not limited to the above embodiments, but can be variously deformed. For example, the configurations described in the respective embodiments may be combined together. Alternatively, those configurations can be replaced with substantially identical configurations, configurations having the same operational effects, or configurations that can achieve the same object.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device having a display area in which a plurality of pixels are formed to display an image, each of the plurality of pixels comprising:

a scanning signal line;

a bright control unit having a first transistor that controls brightness of the pixel by light emission;

a light emission color control unit having a second transistor that controls a light emission color in the pixel by controlling a transmission wavelength band of a light emitted from the brightness control unit to be transmitted, wherein a light emission color control signal for controlling the transmission wavelength band to control the light emission color in the pixel is input to the light emission control unit in each pixel, and the first transistor and the second transistor are electrically connected to the scanning signal line.

2. The display device according to claim 1, further comprising: a light emission color control signal output unit that outputs the light emission color control signal, wherein the light emission color control signal output unit outputs the light emission color control signal input to the plurality of pixels within the display area, individually, or outputs the light emission color control signal input in common to a plurality of pixels within each of partitioned areas into which the display area is partitioned.

3. The display device according to claim 2 wherein the light emission color control unit includes an organic electrochromic layer.

4. The display device according to claim 3 wherein the organic electrochromic layer is held between a first electrode layer and a second electrode layer, and the transmission wavelength band is controlled according to a signal supplied between the first electrode layer and the second electrode layer, wherein the second electrode layer is formed in common to the plurality of pixels within the display area, and wherein the first electrode layer is formed for each of the plurality of pixels individually in the display area.

5. The display device according to claim 4, wherein the first electrode layer is connected to a signal line which is formed to extend to an outside of the display area, and transmits the light emission color control signal, through a contact hole formed outside of the display area.

6. The display device according to claim 4, wherein the brightness control unit includes an organic EL layer that emits a light by organic electroluminescence, and wherein the organic EL layer is held between the second layer and a third electrode layer formed on a side opposite to the first electrode layer across the second electrode layer, and a brightness in the pixels in controlled according to a signal supplied between the sound electrode layer and the third electrode layer.

7. The display device according to claim 4, wherein the first electrode is an upper layer than the second electrode, and the first electrode is electrically connected to the second transistor through a contact hole of the second electrode.

8. The display device according to claim 1, wherein the brightness control unit has a third electrode layer formed in each of the plurality of pixels and a common electrode layer formed in common to the plurality of pixels, the light emission color control unit includes a first electrode layer formed in each of the plurality of pixels, the common electrode layer has a contact hole formed therein, and the first electrode layer is an upper layer than the third electrode layer and the common electrode layer, and is connected to the second transistor though the contact hole of the common electrode layer.

* * * * *